United States Patent [19]

Sugawara et al.

[11] Patent Number: 5,212,244

[45] Date of Patent: May 18, 1993

[54] THERMOSETTING RESIN COMPOSITION, AND PREPREG AND LAMINATED SHEET WHICH USE THE SAME

[75] Inventors: Katuo Sugawara, Hitachi; Akio Takahashi, Hitachiota; Junichi Katagiri, Ibaraki; Akira Nagai; Masahiro Ono, both of Hitachi; Toshikazu Narahara, Ibaraki, all of Japan

[73] Assignee: Hitachi, Ltd., Tokyo, Japan

[21] Appl. No.: 772,846

[22] Filed: Oct. 8, 1991

Related U.S. Application Data

[62] Division of Ser. No. 487,406, Mar. 26, 1990, Pat. No. 5,080,965.

[51] Int. Cl.$^5$ .............................. C08F 709/02
[52] U.S. Cl. ................... 525/193; 525/282; 525/33.4; 525/375; 525/334.1
[58] Field of Search ............ 525/193, 282, 33.4, 525/375; 428/244, 273, 285, 290

[56] References Cited

U.S. PATENT DOCUMENTS 4,229,550 10/1980 Jones et al. ............ 525/282
4,743,647 5/1988 Domier ................ 525/282

FOREIGN PATENT DOCUMENTS 0202488 11/1986 European Pat. Off. .
63-56548 3/1988 Japan .

Primary Examiner—Patrick J. Ryan
Assistant Examiner—Richard C. Weisberger
Attorney, Agent, or Firm—Fay, Sharpe, Beall, Fagan, Minnich & McKee

[57] ABSTRACT

The present invention provide a thermosetting resin composition comprising (a) a poly-p-hydroxstyrene derivative represented by the general formula

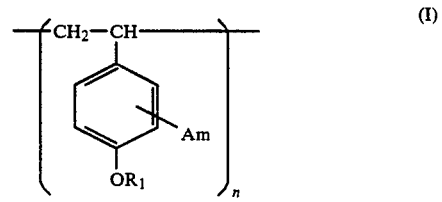

wherein A is a halogen group, $R_1$ is an alkenyl or alkenoyl group of 2 to 4 carbon atoms, m denotes a number of 1 to 4 and from more than denotes a number of 1 to 100, (b) an epoxy-modified polybutadiene, and (c) an aromatic maleimide compound, and a prepreg and a laminated sheet which use said resin composition.

1 Claim, 1 Drawing Sheet

THERMOSETTING RESIN COMPOSITION, AND PREPREG AND LAMINATED SHEET WHICH USE THE SAME

This is a divisional of co-pending application Ser. No. 487,406, filed on Mar. 26, 1990, now U.S. Pat. No. 5,080,965.

BACKGROUND OF THE INVENTION

1. Field of the Invention

The present invention relates to a thermosetting resin composition and to a prepreg and a laminated sheet which use the resin composition. Particularly it relates to a laminate material suitable for a multilayer printed circuit board which is excellent in flame resistance, heat resistance and electrical properties and shows a low shrinkage percentage in curing.

2. Description of the Prior Art

Laminate materials hitherto mainly used for multilayer printed circuit boards are phenol resins, epoxy resins, polyimide resins and the like to which brominated modified resins or additive-type flame retarders have been added, to impart them flame resistance. Particularly for large-scaled computers, for which an increasingly higher density has been desired, polyimide-type resins which are excellent in heat resistance and dimensional stability have been used. In recent years, however, with increase in the processing speed of large-scaled computers, printed circuit boards of low dielectric constant have come to be required to increase the signal transmission rate. To serve as such laminate materials of a low dielectric constant, there have been developed laminated sheets comprising polytetrafluoroethylene (PTFE) resin or polybutadiene resin. With regard to laminated sheets of this kind, mention may be made, for example, of Proc. NEPCON (1981), pp. 160–169 and Japanese Patent Application Kokai (Laid-Open) No. 126,451/80.

Further, Japanese Patent Application Kokai (Laid-Open) No. 33,050/86 discloses a flame resistant resin composition of a low dielectric constant which comprises a poly(p-hydroxystyrene) derivative and an epoxidized polybutadiene.

However, PTFE laminated sheets have a high thermal expansion coefficient and hence an insufficient dimensional stability at high temperatures because PTFE resin is thermoplastic and has a low glass transition temperature. Particularly, they show an unsatisfactory through-hole reliability in multilayer bonding. Further, PTFE is generally bonded by means of heat melting pressure bonding owing to lack of suitable solvents, so that its very high melting temperature is disadvantageous. On the other hand, polybutadiene resin has a defect of being easily combustible owing to its molecular structure, so that it must be incorporated, to be imparted flame resistance, with additive-type flame retarders such as decabromodiphenyl ether and tryphenyl phosphate or reactive flame retarders such as tribromophenyl methacrylate and tribromophenyl acrylate. The incorporation of these retarders raises the problem of deteriorating the good electrical properties, heat resistance and dimensional stability which are inherent in polybutadiene resin.

SUMMARY OF THE INVENTION

An object of the present invention is to provide a laminate material which has a good flame resistance and low dielectric constant and enables a high density wiring of the same level as that obtainable by polyimide laminate materials, as a material capable of replacing polyimide-type multilayer printed wiring board hitherto used in large-scaled computers.

The first of the present invention relates to a flame resistant thermosetting resin composition which comprises a poly(p-hydroxystyrene) derivative represented by the general formula [I]

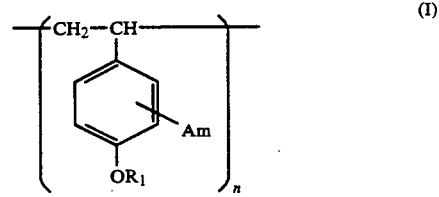

wherein A is a halogen group, $R_1$ is an alkenyl or alkenoyl group of 2 to 4 carbon atoms, m denotes a number of from more than 1 to 4 and n denotes a number of 1 to 100, compounded with an epoxy-modified polybutadiene represented by the general formula (II)

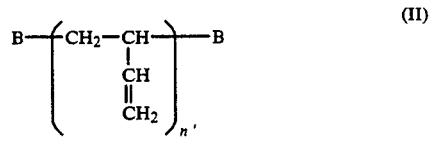

wherein B is residue of a glycidyl ether epoxy resin and n' denotes a number of 4 to 100, and with an aromatic maleimide compound represented by the general formula (III)

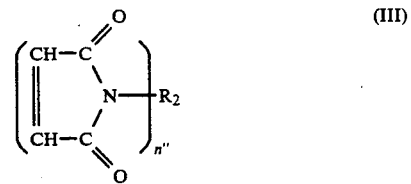

wherein $R_2$ is an aromatic group containing at least one benzene ring and n" denotes a number of 1 to 4.

The second of the present invention relates to a prepreg using the resin composition stated above which comprises a fibrous base material impregnated with a varnish-like solution obtained by dissolving in a solvent a poly(p-hydroxystyrene) derivative represented by the general formula (I)

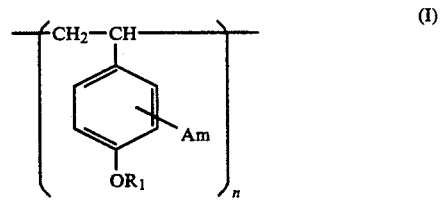

wherein A is a halogen group, $R_1$ is an alkenyl or alkenoyl group of 2 to 4 carbon atoms such as the allyl, butenyl, vinyl, acryloyl, methacryloyl and epoxymethacryloyl group, m denotes a number of 1 to 4 and n denotes a number of from more than 1 to 100, an epoxy-modified polybutadiene represented by the general formula (II)

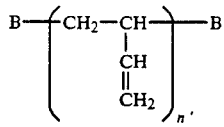
(II)

wherein B is a residue of a glycidyl ether epoxy resin and n' denotes a number of 4 to 100, and an aromatic maleimide compound represented by the general formula (III)

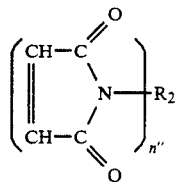
(III)

wherein $R_2$ is an aromatic group containing at least one benzene ring and n" denotes a number of 1 to 4.

The third of the present invention relates to a laminated sheet using said resin composition which is obtained by laminating and bonding a prepreg comprising a fibrous base material impregnated with a composition comprising a poly(p-hydroxystyrene) derivative represented by the general formula (I)

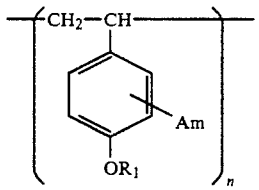
(I)

wherein A is a halogen group, $R_1$ is an alkenyl or alkenoyl group of 2 to 4 carbon atoms such as the allyl, butenyl, vinyl, acryloyl, methacryloyl and epoxymethacryloyl group, m denotes a number of 1 to 4 and n denotes a number of from more than 1 to 100, an epoxy-modified polybutadiene represented by the general formula (II)

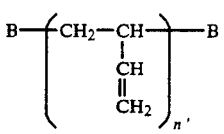
(II)

wherein B is a residue of a glycidyl ether epoxy resin and n denotes a number of 4 to 100, and an aromatic maleimide compound represented by the general formula (III)

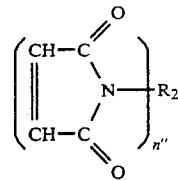
(III)

wherein $R_2$ is an aromatic group containing at least one benzene ring and n denotes a number of 1 to 4.

DETAILED DESCRIPTION OF THE INVENTION

Figure 1:
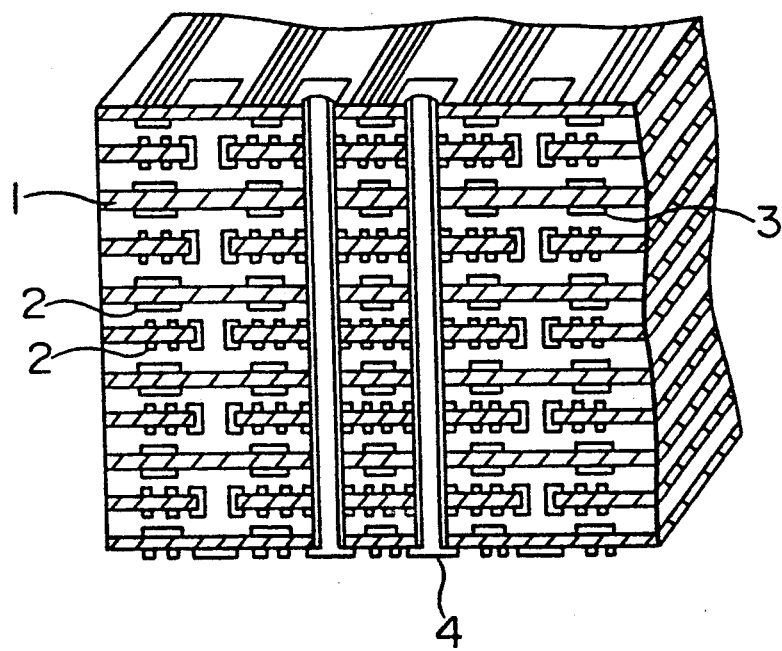
FIG. 1 is a sectional perspective view of a multilayer printed circuit board representing on embodiment of the present invention.

The thermosetting resin composition of the present invention comprises three components represented by the general formulas (I), (II) and (III) as described above. Typical examples of the compound represented by the general formula (I) include brominated products of vinyl ether, isobutenyl ether or allyl ether of poly(p-hydroxystyrene) and of acrylic ester, methacrylic ester or epoxymethacrylic ester thereof. They may be used each alone or in combination of two or more thereof according to necessity.

In the epoxy-modified polybutadiene represented by the general formula (II), which is one of the thermosetting resins used in the present invention, specific examples of the glycidyl ether-type epoxy resin used for modification include diglycidyl ether bisphenol A, diglycidyl ether 2,2'-dibromobisphenol A, diglycidyl ether 2,2',4,4'-tetrabromobisphenol A, diglycidyl ether 2,2'-dimethylbisphenol A, diglycidyl ether 2,2',4-trimethylbisphenol A, phenol novolak-type epoxy resin and ortho-cresol novolak-type epoxy resin. They may be used each alone or in combination of two or more thereof according to necessity.

Specific examples of the aromatic maleimide compound represented by the general formula (III), one of the thermosetting resins used in the present invention, include bismaleimides such as N,N'-m-phenylenebisleimide, N,N'-p-phenylenebismaleimide, N,N'-4,4'-diphenylmethanebismaleimide, N,N-4,4'-(diphenylether)bismaleimide, N,N'-methylenebis(3-chloro-p-phenylene)-bismaleimide, N,N'-4,4'-(diphenyl sulfone)-bismaleimide, N,N'-m-xylenebismaleimide, N,N'-4,4'-diphenylcyclohexanebismaleimide, N,N'-4,4'-diphenylpropanebismaleimide, 2,2'-bis[4-(4-maleimidephenoxy)-phenyl]propane, 2,2-bis[3-methyl-4-(4-maleimidephenoxy)phenyl]propane, 2,2-bis[4-(4-maleimidephenoxy)phenylhexafluoropropane, 2,2'-bis(4-maleimidephenyl)hexafluoropropane, 1,3-bis(-3maleimidephenoxy)benzene and 3,3'-bismaleimidebenzophenone; and monomaleimides such as N-phenylmaleimide, N-3-chlorophenylmaleimide, N-o-tolylmaleimide, N-mtolylmaleimide, N-p-tolylmaleimide, N-o-methoxyphenylmaleimide, N-m-methoxyphenylmaleimide, N-p-methoxyphenylmaleimide, N-benzylmaleimide, N-pyridylmaleimide, N-hydroxyphenylmaleimide, N-acetoxyphenylmaleimide, N-dichlorophenylmaleimide, N-benzophenonemaleimide, N-(diphenyl ether)maleimide and N-acetylphenylmaleimide. They may be used each alone or in combination of two or more thereof according to necessity.

The aromatic maleimide compounds used in the present invention give more excellent heat resistance as compared with aliphatic ones.

The curing of the thermosetting resin composition comprising the mixture of the components represented by the general formulas (I) (II) and (III) described above can be promoted by the addition of a radical polymerization initiator and an epoxy curing agent.

Typical examples of the radical polymerization initiator include benzoyl peroxide, dicumyl peroxide, methyl ethyl ketone peroxide, t-butyl peroxylaurate, di-t-butyl peroxyphthalate, dibenzyl peroxide, 2,5-dimethyl-2,5-di(t-butylperoxy)hexane, t-butylcumyl peroxide, t-butyl hydroperoxide, di-t-butyl peroxide, 2,5-dimethyl-2,5-di(t-butylperoxy)hexyne (3), diisopropylbenzene hydroperoxide, p-menthane hydroperoxide, pinane hydroperoxide, 2,5-dimethylhexane-2,2-dihydroperoxide, and cumene hydroperoxide. They are preferably added in an amount of 0.1 to 10 parts by weight relative to 100 parts by weight of the resin composition.

Typical examples of the epoxy curing agent include 4,4'-diaminodicyclohexylmethane, 1,4-diaminocyclohexane, 2,6-diaminopyridine, m-phenylenediamine, p-phenylenediamine, 4,4'-diaminodiphenylmethane, 2,2'-bis(4-aminophenyl)propane, 4,4'-diaminophenyl oxide, 4,4'-diaminophenyl sulfone, bis(4-aminophenyl)methylphosphine oxide, bis(4-aminophenyl)phenylphosphine oxide, bis(4-aminophenyl)methylamine, 1,5-diaminonaphthalene, m-xylylenediamine, 1,1'-bis(p-aminophenyl)-furazane, p-xylylenediamine, hexamethylenediamine, 6,6'-diamino-2,2'-dipyridyl, 4,4'-diaminobenzophenone, 4,4'-diaminoazobenzene, bis(4-aminophenyl) phenylmethane, 1,1'-bis(4-aminophenyl)-cyclohexane, 1,1'-bis(4-amino 3-methylphenyl)cyclohexane, 2,5-bis(m-aminophenyl)-1,3,4-oxadiazole, 2,5-bis(p-aminophenyl)-1,3 4-oxadiazole, 2,5-bis(m-aminophenyl)thiazolo(4,5-d)thiazole, 5,5'-di(m-aminophenyl)2,2'-bis(1,3,4-oxadiazolyl), 4,4'-diaminodiphenyl ether, 4,4'-bis(b-aminophenyl)-2,2'-dithiazole, m-bis(4-p-aminophenyl-2-thiazolyl)benzene, 4,4'-diaminobenzanilide, 4,4'-diaminophenyl benzoate, N,N'-bis(4-aminobenzyl)-p-phenylenediamine, 4,4'-methylenebis(2-dichloroaniline), benzoguanamine, methylguanamine, tetramethylbutanediamine, phthalic anhydride, trimellitic anhydride, pyromellitic anhydride, benzophenonetetracarboxylic acid anhydride, ethylene glycol bis(anhydrotrimellitate), glycerol tris-(anhydrotrimellitate), maleic anhydride, 2-methylimidazole, 2-phenylimidazole, 2-ethyl-4-methylimidazole, 1-cyanoethyl2-ethyl-4-methylimidazole, 2-undecylimidazole, and 2-heptadecylimidazole. At least one such curing agent is used. The suitable amount of curing agents to be used is 0.1 to 30 parts by weight, preferably 0.3 to 10 parts by weight, relative to 100 parts by weight of epoxy-modified polybutadiene.

The radical polymerization initiator and the epoxy curing agent may also be used together as occasion demands.

The mixing proportion of the above-mentioned thermosetting resin composition can be varied depending on necessity. In general, as the proportion of the poly(p-hydroxystyrene) derivative of the formula (I) increases, the flame resistance and mechanical strength tend to improve, whereas the flexibility tends to decrease and the shrinkage in curing to increase. As the proportion of the epoxy-modified polybutadiene of the formula (II) increases, the flexibility and the adhesion to copper foil tend to improve, whereas the heat resistance tends to decrease. As the proportion of the aromatic maleimide of the formula (III) increases, the flame resistance and heat resistance tend to improve, shrinkage in curing to decrease and dimensional stability to improve.

The thermosetting resin composition of the present invention is preferably prepared so as to comprise
10 to 60 % by weight, particularly 20 to 40% by weight, of the component of the formula (I),
10 to 60% by weight, particularly 10 to 30% by weight, of the component of the formula (II), and
20 to 70% by weight, particularly 30 to 60% by weight, of the component of the formula (III).

The composition of the present invention may be incorporated with, as the fourth component, an aromatic amine as occasion demands.

Examples of the aromatic amine include 4,4'-diaminodiphenylmethane, 4,4'-diaminodiphenyl sulfone, 4,4'-diaminodiphenyl ether, 2,2-bis[4-(4-aminophenoxy)-phenyl]propane, 2,2-bis[4-(4-aminophenoxy)-phenyl]hexafluoropropane, 4,4'-bis(3-aminophenoxy)-biphenyl, and 1,3-bis(3-aminophenoxy)benzene.

A general process for producing a laminated sheet according to the present invention will be described below.

First, a varnish is prepared by dissolving the poly(p-hydroxystyrene) derivative, epoxy-modified polybutadiene and aromatic maleimide in an organic solvent. Examples of usable organic solvents include toluene, xylene, acetone, methyl ethyl ketone, methyl isobutyl ketone, N,N-dimethylformamide, N-methylpyrrolidone, dimethyl sulfoxide, trichloroethylene, trichloroethane, methylene chloride, dioxane and ethyl acetate.

The varnish may be heated to undergo preliminary reaction depending on necessity for adjusting the flowability and gellation time of the resin exhibited at the time of preparing the laminated sheet. Further, it may be incorporated with a coupling agent to improve its adhesion to the base material. The varnish thus prepared is then incorporated with a radical polymerization initiator and an epoxy curing agent to form an impregnation varnish.

The impregnation varnish thus obtained is then applied to a sheet-formed base material by impregnation and the resulting product is dried at from room temperature to 170° C. to give a prepreg free from tackiness. The drying temperature is selected depending on the kinds of solvents and initiators used. Finally, a necessary number of sheets of the prepreg obtained above are piled up and heat-cured at 100° to 250° C. under a pressure of 1 to 100 kgf/cm$^2$ to give a laminated sheet.

Almost all of the sheet-formed materials conventionally used for laminate materials may be employed in the present invention. Examples of inorganic fibers include fibers of various glasses such as E glass, C glass, A glass, S glass, D glass and YM-31-A glass, which comprise SiO$_2$, Al$_2$O$_3$ and other components, and Q glass made of quartz, and ceramic fibers. Examples of organic fibers include aramid fiber made of a high molecular compound having an aromatic polyamide-imide skeleton.

Although the reason of the low shrinkage percentage of the present resin composition in curing is not yet clear, it can presumably be attributed to the incorporation of the maleimide compound.

Since the shrinkage percentage in curing is low, accumulation of stress in cured products, namely laminated sheets and the like, is also low and consequently development of cracks is rarely observed.

EXAMPLE

Example 1

In a solvent mixture consisting of 100 parts by weight of methyl isobutyl ketone and 150 parts by weight of acetone were dissolved 50 parts by weight of methacrylic ester of brominated poly(p-hydroxystyrene) (the ester had a molecular weight of 7,000 to 12,000 and a bromine content of 42%), 30 parts of weight of polybutadiene modified with diglycidyl ether bisphenol A, and 20 parts by weight of 2,2'-bis[4-4(maleimidephenoxy)-phenyl], propane, and the solution was heated with stirring at 50° to 70° C. Further, 0.5 part by weight of 2,5-dimethyl-2,5-di(t-butylperoxy)hexyne (3) as a radical polymerization initiator and 2 parts by weight of benzoguanamine as an epoxy curing agent were added to the solution and the resulting mixture was stirred until complete dissolution, to give a varnish.

The varnish obtained above was deaerated and stripped of the solvent while being heated in an evaporator at 40° to 50° C. under reduced pressure, to give a solid resin composition. The resin composition was placed in a mold treated with a mold release agent, then heated at 130° to 150° C. to become liquid, deaerated and defoamed under reduced pressure, and heat-cured under conditions of 170° C. for 120 minutes, 200° C. for 120 minutes and 230° C. for 120 minutes to give a resin sheet.

EXAMPLES 2 TO 13 AND EXAMPLES 2 TO 13 AND COMPARATIVE EXAMPLES 1 TO 6

Resin sheets were prepared in approximately the same manner as in Example 1 but according to the mixing proportions shown in Tables 1 and 2.

In Example 11 and Comparative Example 4, the acrylic ester of brominated poly(p-hydroxystyrene) used had a molecular weight of 7,000 to 12,000 and a bromine content of 45%; in Example 12 and Comparative Example 5, the allyl ether of brominated poly(p-hydroxystyrene) used had a molecular weight of 7,000 to 12,000 and a bromine content of 43%; and in Example 13 and Comparative Example 6, the epoxymethacrylic ester of brominated poly(p-hydroxystyrene) used had a molecular weight of 7,000 to 12,000 and a bromine content of 35%.

Table 3 shows important characteristics of the resin sheets prepared in Examples and Comparative Examples described above.

TABLE 1

|  | Example | | | | | | | | | | | | |
|---|---|---|---|---|---|---|---|---|---|---|---|---|---|
|  | 1 | 2 | 3 | 4 | 5 | 6 | 7 | 8 | 9 | 10 | 11 | 12 | 13 |
| Methacrylic ester of brominated poly(p-hydroxystyrene) | 50 | 30 | 20 | 20 | 20 | 20 | 20 | 20 | 70 | 10 | — | — | — |
| Acrylic ester of brominated poly(p-hydroxystyrene) | — | — | — | — | — | — | — | — | — | — | 20 | — | — |
| Allyl ester of brominated poly(p-hydroxystyrene) | — | — | — | — | — | — | — | — | — | — | — | 20 | — |
| Epoxymethacrylic ester of brominated poly(p-hydroxystyrene) | — | — | — | — | — | — | — | — | — | — | — | — | 20 |
| Polybutadiene modified with cresol novolak epoxy | 30 | 30 | 30 | 30 | 20 | 10 | 30 | 30 | 10 | 60 | 30 | 30 | 30 |
| 2,2'-Bis[4-(4-maleimidephenoxy)phenyl]propane | 20 | 40 | 50 | 50 | 60 | 70 | — | 25 | 20 | 30 | 50 | 50 | 50 |
| N,N'-4,4'-Diphenylmethane-bismaleimide | — | — | — | — | — | — | 50 | 25 | — | — | — | — | — |
| 2,5-Dimethyl-2,5-di(t-butylperoxy)hexyne (3) | 0.5 | 0.5 | 0.5 | — | 0.5 | 0.5 | 0.5 | 0.5 | 0.5 | 0.5 | 0.5 | 0.5 | 0.5 |
| Benzoguanamine | 2 | 2 | 2 | 2 | 2 | 2 | 2 | 2 | 2 | 2 | 2 | 2 | 2 |

TABLE 2

|  | Comparative Example | | | | | |
|---|---|---|---|---|---|---|
|  | 1 | 2 | 3 | 4 | 5 | 6 |
| Methacrylic ester of brominated poly(p-hydroxystyrene) | 60 | 50 | 40 | — | — | — |
| Acrylic ester of brominated poly(p-hydroxystyrene) | — | — | — | 50 | — | — |
| Allyl ester of brominated poly(p-hydroxystyrene) | — | — | — | — | 50 | — |
| Epoxymethacrylic ester of brominated poly(p-hydroxystyrene) | — | — | — | — | — | 50 |
| Polybutadiene modified with cresol novolak epoxy | 40 | 50 | 60 | 50 | 50 | 50 |
| 2,5-Dimethyl-2,5-di(t-butylperoxy)hexyne (3) | 0.5 | 0.5 | 0.5 | 0.5 | 0.5 | 0.5 |
| Benzoguanamine | 2 | 2 | 2 | 2 | 2 | 2 |

TABLE 3

| Item | Example | | | | | | | | | | | | |
|---|---|---|---|---|---|---|---|---|---|---|---|---|---|
|  | 1 | 2 | 3 | 4 | 5 | 6 | 7 | 8 | 9 | 10 | 11 | 12 | 13 |
| Thermal decomposition temperature (°C.) | 330 | 340 | 350 | 350 | 350 | 350 | 350 | 350 | 320 | 320 | 355 | 340 | 330 |
| Linear expansion coefficient ($\times 10^{-4}$/°C.) | 6.5 | 6.0 | 4.5 | 5.0 | 4.5 | 4.0 | 3.5 | 4.5 | 6.5 | 7.0 | 8.0 | 8.0 | 7.5 |
| Volume contraction percentage in curing (%) | 6 | 5 | 4 | 4 | 4 | 4 | 7 | 6 | 9 | 8 | 6 | 6 | 5 |
| Bending strength (kg·f/mm$^2$) RT | 10 | 11 | 12 | 9 | 12 | 12 | 14 | 13 | 9 | 8 | 10 | 10 | 11 |
| Bending strength (kg·f/mm$^2$) 180° C. | 5 | 6 | 7 | 4 | 7 | 8 | 8 | 7 | 3 | 2 | 4 | 4 | 5 |

Comparative Example

TABLE 3-continued

| Item | 1 | 2 | 3 | 4 | 5 | 6 |
|---|---|---|---|---|---|---|
| Thermal decomposition temperature (°C.) | 320 | 310 | 310 | 330 | 300 | 300 |
| Linear expansion coefficient ($\times 10^{-4}$/°C.) | 10 | 9.5 | 9.0 | 11 | 11 | 10 |
| Volume contraction percentage in curing (%) | 15 | 14 | 13 | 16 | 16 | 10 |
| Bending strength (kg·f/mm$^2$) RT | — | — | — | — | — | — |
| Bending strength (kg·f/mm$^2$) 180° C. | — | — | — | — | — | — |

Note:
For bending strength in Comparative Examples 1 to 6, test pieces could not be prepared owing to severe development of cracks.

EXAMPLE 14

In a solvent mixture consisting of 100 parts by weight of methyl isobutyl ketone and 150 parts by weight of dimethylformamide were dissolved 50 parts by weight of methacrylic ester of brominated poly(p-hydroxystyrene) (the ester had a molecular weight of 7,000 to 12,000 and a bromine content of 42%), 30 parts by weight of polybutadiene modified with diglycidyl ether bisphenol A, and 20 parts by weight of 2,2'-bis[4-(4-maleimidephenoxy)phenyl]propane and the solution was heated with stirring at 100° to 120° C. for 30 minutes. Further, 0.5 part by weight of 2,5-dimethyl-2,5-di(t-butylperoxy)hexyne (3) as a polymerization initiator and 2 parts by weight of benzoguanamine as an epoxy curing agent were added to the solution and the resulting mixture was stirred until complete dissolution, to give a varnish.

The varnish obtained above was applied to a glass cloth (E-glass, 0.1 mm thick) by impregnation, air-dried at room temperature, and then dried at 150° C. for 10 to 20 minutes to obtain a tack-free prepreg. Then, 10 sheets of the prepreg were piled up, heated at a pressure of 40 kg.f/cm$^2$ and a temperature of 130° C. for 30 minutes, and further pressed at 170° C. for 1 hour and at 220° C. for 2 hours to give a laminated sheet. Examples 15 to 21 and Comparative Examples 7 to 10.

Laminated sheets were prepared in the same manner as in Example 14 but according to the mixing proportions shown in Table 4.

In Example 19, the acrylic ester of brominated poly(p-hydroxystyrene) used had a molecular weight of 7,000 to 12,000 and a bromine content of 45%; in Example 20, the allyl ether of brominated poly(p-hydroxystyrene) used had a molecular weight of 7,000 to 12,000 and a bromine content of 43%; and in Example 1, the epoxymethacrylic ester of brominated poly(p-hydroxystyrene) used had a mclecular weight of 7,000 to 12,000 and a bromine content of 35%.

Comparative Examples 11 and 12 stand for an epoxy resin laminated sheet and a polyimide resin laminated sheet, respectively.

TABLE 4

|  | Example |  |  |  |  |  |  |  | Comparative Example |  |  |  |
|---|---|---|---|---|---|---|---|---|---|---|---|---|
|  | 14 | 15 | 16 | 17 | 18 | 19 | 20 | 21 | 7 | 8 | 9 | 10 |
| Methacrylic ester of brominated poly(p-hydroxystyrene) | 50 | 30 | 20 | 20 | 20 | — | — | — | 50 | — | — | — |
| Acrylic ester of brominated poly(p-hydroxystyrene) | — | — | — | — | — | 20 | — | — | — | 50 | — | — |
| Allyl ether of brominated poly(p-hydroxystyrene) | — | — | — | — | — | — | 20 | — | — | — | 50 | — |
| Epoxymethacrylic ester of brominated poly(p-hydroxystyrene) | — | — | — | — | — | — | — | 20 | — | — | — | 50 |
| Polybutadiene modified with cresol novolak epoxy | 30 | 30 | 30 | 30 | 30 | 30 | 30 | 30 | 50 | 50 | 50 | 50 |
| 2,2'-Bis[4-(4-maleimidephenoxy)-phenyl]propane | 20 | 40 | 50 | — | 25 | 50 | 50 | 50 | — | — | — | — |
| N,N'-4,4'-Diphenylmethanebis-maleimide | — | — | — | 50 | 25 | — | — | — | — | — | — | — |
| 2,5-Dimethyl-2,5-di(t-butylperoxy)-hexyne (3) | 0.5 | 0.5 | 0.5 | 0.5 | 0.5 | 0.5 | 0.5 | 0.5 | 0.5 | 0.5 | 0.5 | 0.5 |
| Benzoguanamine | 2 | 2 | 2 | 2 | 2 | 2 | 2 | 2 | 2 | 2 | 2 | 2 |

TABLE 5

|  | Example |  |  |  |  |  |  |  | Comparative Example |  |  |  |  |  |  |
|---|---|---|---|---|---|---|---|---|---|---|---|---|---|---|---|
|  | 14 | 15 | 16 | 17 | 18 | 19 | 20 | 21 | 7 | 8 | 9 | 10 | 11 | 12 | 13 |
| Specific inductive capacity (δt 1 MHz) | 3.4 | 3.5 | 3.5 | 3.5 | 3.5 | 3.6 | 3.4 | 3.6 | 3.5 | 3.5 | 3.4 | 3.8 | 4.7 | 4.7 | 3.6 |
| Linear expansion coefficient ($\times 10^{-5}$/°C.) | 6.0 | 5.5 | 5.0 | 4.5 | 4.0 | 5.5 | 5.5 | 7.0 | 8.0 | 0 | 11 | 13 | 20 | 6.0 | 15 |
| Soldering heat resistance (260° C., 300 seconds) | ○ | ○ | ○ | ○ | ○ | ○ | ○ | ○ | ○ | ○ | ○ | ○ | x | ○ | ○ |
| Flame resistance UL-94 | V-0 | V-0 | V-0 | V-0 | V-0 | V-0 | V-0 | V-0 | V-0 | V-0 | V-0 | V-0 | V-0 | V-1 | HB |
| Bending strength (kg·f/mm$^2$) at RT | 45 | 47 | 50 | 60 | 55 | 50 | 45 | 45 | 40 | 37 | 35 | 40 | 45 | 45 | 28 |
| Bending strength (kg·f/mm$^2$) at 180° C. | 25 | 30 | 30 | 35 | 33 | 27 | 25 | 25 | 20 | 7 | 4 | 5 | — | 30 | 20 |
| Bending strength retention after thermal deteriora- | 25 | 37 | 40 | 45 | 42 | 22 | 20 | 20 | 20 | 15 | 15 | 15 | <10 | 80 | 20 |

TABLE 5-continued

| | Example | | | | | | | | Comparative Example | | | | | | |
|---|---|---|---|---|---|---|---|---|---|---|---|---|---|---|---|
| | 14 | 15 | 16 | 17 | 18 | 19 | 20 | 21 | 7 | 8 | 9 | 10 | 11 | 12 | 13 |
| tion at 200° C. for 10 days (%) | | | | | | | | | | | | | | | |

TABLE 6

| | Example | | | | | | | | Comparative Example | | | |
|---|---|---|---|---|---|---|---|---|---|---|---|---|
| | 22 | 23 | 24 | 25 | 26 | 27 | 28 | 29 | 14 | 15 | 16 | 17 |
| Methacrylic ester of brominated poly(p-hydroxystyrene) | 50 | 30 | 20 | 20 | 20 | — | — | — | 50 | — | — | — |
| Acrylic ester of brominated poly(p-hydroxystyrene) | — | — | — | — | — | 20 | — | — | — | 50 | — | — |
| Allyl ether of brominated poly(p-hydroxystyrene) | — | — | — | — | — | — | 20 | — | — | — | 50 | — |
| Epoxymethacrylic ester of brominated poly(p-hydroxystyrene) | — | — | — | — | — | — | — | 20 | — | — | — | 50 |
| Polybutadiene modified with cresol novolak epoxy | 30 | 30 | 30 | 30 | 30 | 30 | 30 | 30 | 50 | 50 | 50 | 50 |
| 2,2'-Bis[4-(4-maleimidephenoxy)-phenyl]propane | 20 | 40 | 50 | — | 25 | 50 | 50 | 50 | — | — | — | — |
| N,N'-4,4'-Diphenylmethanebis-maleimide | — | — | — | 50 | 25 | — | — | — | — | — | — | — |
| 2,5-Dimethyl-2,5-di(t-butylperoxy)-hexyne (3) | 0.5 | 0.5 | 0.5 | 0.5 | 0.5 | 0.5 | 0.5 | 0.5 | 0.5 | 0.5 | 0.5 | 0.5 |
| Benzoguanamine | 2 | 2 | 2 | 2 | 2 | 2 | 2 | 2 | 2 | 2 | 2 | 2 |

COMPARATIVE EXAMPLE 13

Fifty parts by weight of 1,2-polybutadiene prepolymer and 50 parts by weight of cresol novolak-type epoxy-modified polybutadiene were dissolved in xylene to give a varnish of a solid content of 20 to 30% by weight. Further, 2 parts by weight of dicumyl peroxide as a radical polymerization initoator and 1 part by weight of 2-ethyl-4-methylimidazole as an epoxy curing agent were added to the varnish. Thereafter, the same procedures as in Example 14 were followed to obtain a laminated sheet.

Table 5 shows important characteristics of the laminated sheets obtained in Examples and Comparative Examples described above.

EXAMPLE 22

To the both sides of a prepreg obtained according to the method described in Example 14 and using the resin composition shown in Table 6, were laminated a copper foil of 35 μm thickness whose surface had been roughened on the prepreg side. The whole was heated under a pressure of 30 kgf/cm² at a temperature of 130° C. for 30 minutes, at 170° C. for 1 hour and at 200° C. for 2 hours to give a copper plated laminated sheet. The thickness of the insulating layer was about 100 μm. The copper plated laminated sheet obtained above was processed by the photo-etching method to form an inner layer circuit pattern including a signal layer, power source layer, matching layer and so forth. Then, the copper surface of the circuit pattern was treated in the following manner to form a double side wiring unit circuit sheet.

Trichlene washing ⟶

{ immersion in cupric cloride/hydrochloric acid solution (1) (40° to 50° C, 2 minutes) } ⟶

-continued water washing ⟶ { immersion in 10% sulfuric acid (room temp., 2 min.) } ⟶ water washing ⟶ air blowing ⟶

{ immersion in oxide film forming solution (2) (70° to 80° C, 2 min.) } ⟶ water washing ⟶ drying (100° C, 30 minutes)

Solution Compositon (1) Conc. hydrochloric acid 300 g, cupric chloride 50 g, distilled water 650 g (for roughening the copper surface).

(2) Sodium hydroxide 5 g, sodium tertiary phosphate 10 g, sodium chlorite 30 g, distilled water 955 g (for stabilizing the copper surface).

After completoin of the above treatment, the resulting circuit sheets and the above-mentioned prepreg resin sheets were combined into a structure shown in FIG. 1 to form 30 layers of circuit conductor layer 2. Then, bonding was effected under conditions of a pressure of 40 kg/cm², at 170° C. for 90 minutes and at 220° C. for 90 minutes to prepare a multilayer printed circuit board.

In the multilayer bonding, guide pins were inserted into holes provided at the four corners of the sheets so as to prevent missalignment. After the multi-layer bonding, a hole of 0.3 mm or 0.6 mm diameter was made by means of a micro-drill, and chemical copper plating was applied to the whole surface of the hole to form a through-hole conductor 4. Subsequently, the outermost circuit was formed by etching, thus to complete a multilayer printed circuit board.

In the present Example, a multilayer printed circuit board having a dimension of 570 mm×420 mm×about 3.5 mm (thickness) could be obtained in which the line width was either 70 μm or 100 μm, the channel/grid ratio was 2-3/1.3 mm, and the layer-to-layer shear was about 100 μm or less. The glass cloth amounted to about 30% by volume of the insulating layer.

In FIG. 1, 1 and 3 indicate an insulating layer, 2 a circuit conductor layer, and 4 a through hole; 1 is the above stated copper-plated laminate substrate and 3 is the prepreg resin sheet. Examples 23 to 29 and Comparative Examples 14 to 17.

Multilayer printed circuit boards were prepared in the same manner as in Example 22 and by using respective resin compositions shown in Table 6.

Table 7 shows the results of test for soldering heat resistance and thermal shock characteristic determined with test pieces cut out from the multilayer printed circuit board.

until development of cracks, temperature change from −60° C. to +125° C. being taken as one cycle (∞).

The resin composition of the present invention exhibits a low volume contraction percentage in curing as compared with prior resin compositions of a low dielectric constant and hence has a good moldability.

The laminate material using the resin composition of the present invention has a low dielectric constant similarly to polybutadiene-type materials generally known as low dielectric constant materials. Since the specific inductive capacity of the material of the present invention can be as low as about 3.5 as compared with 4.7 of that of epoxy-type materials and polyimide-type materials presently used for multilayer printed circuit boards of large computers, the use of the material can reduce the signal transmission delay time by 15%.

Further, using the resin composition of the present invention for preparing a multilayer printed circuit board makes it possible to obtain a substrate with an

TABLE 7

|  | Example |  |  |  |  |  |  |  | Comparative Example |  |  |  |
|---|---|---|---|---|---|---|---|---|---|---|---|---|
|  | 22 | 23 | 24 | 25 | 26 | 27 | 28 | 29 | 14 | 15 | 16 | 17 |
| Soldering heat resistance (at 260° C., 300 sec) | ○ | ○ | ○ | ○ | ○ | ○ | ○ | ○ | x* | x* | x* | x* |
| Thermal shock test (∞) −60° C.−+125° C. | 30 | >40 | >40 | >40 | >40 | >40 | >40 | >40 | 5 | 7 | 5 | 5 |

Note:
*Peeling from conductor copper foil develops.

The thermal decomposition temperature was determined in an air atmosphere at a temperature increasing rate of 5° C./min. with 10 mg of pulverized cured resin sample, and referred to the temperature at which a weight loss of 5% was reached.

The linear expansion coefficient was determined by measuring the thermal expansion in the thickness direction at a temperature increasing rate of 2° C./min., and calculated from the dimensional change undergone between 50° C. and 200° C.

The volume contraction percentage in curing was calculated from the difference of the specific gravity of solid before and after curing.

The bending strength was determined with a laminated sheet cut to a dimension of 25×50 mm, under conditions of a distance between the supporting points of 30 mm and a bending rate of 1 mm/min. at room temperature and at 180° C.

The specific inductive capacity was determined according to JISC 6481 by measuring the electrostatic capacity at a frequency of 1 MHz.

The soldering heat resistance and the flexural characteristic were evaluated according to JISC 6481. For soldering heat resistance, the sample was examined for its appearance after standing at 260° C. for 300 seconds.

The flame resistance was determined according to UL-94 vertical method. The thermal shock characteristic was evaluated by determining the number of cycles excellent thermal shock characteristic.

EFFECT OF THE INVENTION

According to the present invention, a resin composition with a low shrinkage percentage can be obtained and a laminated sheet of a low dielectric constant excellent in crack resistance, heat resistance and flame resistance can be provided.

What is claimed is:

1. A laminated sheet formed by laminating a prepreg which comprises a fibrous base material and a thermosetting resin composition comprising
    (a) a prepolymer of a ply(p-hydroxystyrene) derivative represented by the general formula

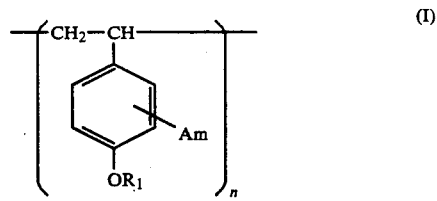

wherein A is a halogen group, $R_1$ is an alkenyl or alkenoyl group of 2 to 4 carbon atoms, m denotes a number of 1 to 4 and n denotes a number of 1 to 100,
    (b) an epoxy-modified polybutadiene, and
    (c) an aromatic malimide compound.

* * * * *